United States Patent
Vernet et al.

(10) Patent No.: US 7,535,782 B2
(45) Date of Patent: May 19, 2009

(54) SENSE AMPLIFIER CIRCUIT AND METHOD FOR A DRAM

(75) Inventors: Marc Vernet, Grenoble (FR); Michel Bouche, Grenoble (FR)

(73) Assignee: STMicroelectronics Crolles 2 SAS, Crolles (FR)

( * ) Notice: Subject to any disclaimer, the term of this patent is extended or adjusted under 35 U.S.C. 154(b) by 0 days.

(21) Appl. No.: 11/439,728

(22) Filed: May 23, 2006

(65) Prior Publication Data

US 2006/0262619 A1 Nov. 23, 2006

(30) Foreign Application Priority Data

May 23, 2005 (FR) .................................. 05 51336

(51) Int. Cl.
*G11C 7/00* (2006.01)
(52) U.S. Cl. ...................... 365/205; 365/154; 365/203; 365/156; 365/189.09; 365/196; 365/202
(58) Field of Classification Search ................ 365/154, 365/205, 203, 156, 189.08, 196, 202
See application file for complete search history.

(56) References Cited

U.S. PATENT DOCUMENTS

| | | | | |
|---|---|---|---|---|
| 3,967,252 A * | 6/1976 | Donnelly | ............... | 365/189.09 |
| 4,025,907 A * | 5/1977 | Karp et al. | ................... | 365/205 |
| 4,551,641 A * | 11/1985 | Pelley, III | ..................... | 327/55 |
| 4,622,655 A * | 11/1986 | Suzuki | ....................... | 365/149 |
| 5,526,314 A | 6/1996 | Kumar | | |
| 6,046,609 A | 4/2000 | Toyoshima et al. | | |
| 6,201,418 B1 | 3/2001 | Allmon | | |
| 7,046,575 B2 * | 5/2006 | Shin | ...................... | 365/230.05 |
| 2001/0004600 A1 * | 6/2001 | Son et al. | ..................... | 455/456 |
| 2004/0165462 A1 * | 8/2004 | Morgan | ...................... | 365/205 |
| 2006/0198220 A1 * | 9/2006 | Yoon et al. | .................. | 365/205 |

OTHER PUBLICATIONS

French Search Report, FR0551336, Feb. 17, 2006.
Barth, J.E., Jr., et al., Embedded DRAM Design and Architecture for the IBM 0.11—μm ASIC offering.

* cited by examiner

*Primary Examiner*—Hoai V Ho
*Assistant Examiner*—Fernando N Hidalgo
(74) *Attorney, Agent, or Firm*—Lisa K. Jorgensen; Paul F. Rusyn; Graybeal Jackson LLP

(57) ABSTRACT

A sense amplifier of a DRAM includes, in series between two terminals of application of a supply voltage, at least one first transistor of a first channel type, and an amplification stage formed of two parallel branches each including a second transistor of the first channel type in series with a transistor of a second channel type. The gates of the transistors of a same branch are connected to the junction point of the transistors of the other branch. Each branch including at least one first additional transistor of the first channel type in parallel with at least each second transistor of the first channel type.

19 Claims, 4 Drawing Sheets

SENSE AMPLIFIER CIRCUIT AND METHOD FOR A DRAM

PRIORITY CLAIM

This application claims priority from French patent application No. 05/51336, filed May 23, 2005, which is incorporated herein by reference.

BACKGROUND OF THE INVENTION

1. Technical Field

Embodiments of the present invention generally relate to DRAMs and, more specifically, to a DRAM cell sense amplifier.

2. Background

FIG. 1 shows a conventional example of a DRAM cell sense amplifier in a configuration with precharge to the ground. To simplify the representation, the actual memory cells have not been shown, and an example of a memory architecture of the type to which embodiments of the present invention applies will be described in relation with FIG. 2.

Amplifier 1 comprises, between two terminals 2 and 3 of application of power supply voltages, respectively Vdd and GND (possibly via a switch not shown), a P-channel MOS transistor MP1 and an amplification stage forming a flip-flop, formed of two parallel branches each comprising a P-channel MOS transistor MP2, respectively MP3, and an N-channel MOS transistor, respectively MN2 and MN3. The junctions 4 and 5 of the respective series associations of transistors MP2 and MN2, and of transistors MP3 and MN3, are connected to so-called true or direct and complementary bit lines TBL and CBL of the memory cell column of the array network to which amplifier 1 is assigned. Terminals 4 and 5 also define respectively direct and complementary output terminals of sense amplifier 1. The gates of transistors MP2 and MN2 are connected to point 5 while the gates of transistors MP3 and MN3 are connected to point 4.

At each read cycle, a single memory cell of the column connected to amplifier 1 is read from, said cell being addressed by selecting a so-called word line by means of a decoder, not shown.

FIG. 2 very schematically and partially shows an example of architecture of a DRAM of the type to which embodiments of the present invention applies. For simplification, a single amplifier 1 (SAi) has been shown. Amplifier 1 is used to read bit lines CBLi and TBLi to which are connected memory cells 10T(ij), 10T(i,j+1) on line TBLi and cells 10C(ij) and 10C(ij+1) on line CBLi. Each cell is formed of a selection transistor T and of a capacitor C between bit line CBLi or TBLi and a bias potential Vp. The respective gates of transistors T are connected to word lines WLj and WLj+1. In FIG. 2, cells 10C(ij) and 10T(ij+1) have been shown in dotted lines to illustrate the fact that, to read, for example, from cell 10T(ij) of line i and of row j, the amplifier SAi assigned to the lines of rank i performs the reading from line TBLi while line CBLi is used as a reference line.

To read from the cells of a DRAM, the bit lines need to be precharged at a given voltage.

A first category of DRAMs provides a precharge of the bit lines to half the supply voltage, Vdd/2.

A second category of DRAMs to which embodiments of the present invention more specifically applies provides a precharge of the bit lines to ground to make the reading faster.

In this case, for each bit line, at least one reference cell 20 is used. Each reference cell 20 is typically formed of a memory point formed of a transistor T and of a capacitor C between line CBLi or TBLi and voltage Vp. The gates of transistors T are respectively connected to selection lines RefWL1 and RefWL2. Further, the memory points of cells 20 are connected by a transistor T to a line 21 of application of a reference voltage Vref (for example, equal to Vdd/2) by being simultaneously controlled by a signal PREF of precharge of the reference cells.

An example of a DRAM using reference cells in a ground precharge configuration is described in article "Embedded DRAM design and architecture for the IBM 0.11-μm ASIC offering" by J. E. Barth, J R. et al., published in IBM J. RES. & DEV., vol. 46, N° 6, November 2002.

The use of reference cells in DRAMS increases the bulk of these memories (4 reference cells are further necessary in case of twisted bit lines in the above-mentioned example).

Further, the use of reference cells requires control of additional transistors, which generates an undesirable consumption equivalent to the reading from four cells instead of one.

Another disadvantage is that this lengthens the read cycles due to the time required to balance the charges of the reference cells.

U.S. Pat. Nos. 5,526,314, 6,046,609 and 6,201,418 disclose sense amplifiers having parallel connected branches of transistors in series, in which junction points of the series associations are not connected to bit lines, the bit lines being connected to gates of additional transistors connected in parallel with transistors of the branches.

SUMMARY

Embodiments of the present invention overcome all or part of the disadvantages of conventional DRAMs and of their reading.

Another embodiment of the present invention is, more specifically, providing a solution avoiding use of reference cells.

A further embodiment of the present invention provides improved sensitivity of the sense amplifier.

According to one embodiment of the present invention, a sense amplifier of a DRAM includes in series between two terminals of application of a supply voltage at least one first transistor of a first channel type and an amplification stage formed of two parallel branches each including a second transistor of the first channel type in series with a transistor of a second channel type. The gates of the transistors of a same branch are connected to the junction of the transistors of the other branch. Each branch includes at least one first additional transistor of the first channel type in parallel with at least each second transistor of the first channel type.

According to an embodiment of the present invention, each first additional transistor is in parallel exclusively with the second transistor of the first channel type of the involved branch.

According to an embodiment of the present invention, each first additional transistor is in series with a second additional transistor of the same type between a first terminal of application of the supply voltage and said junction of the involved branch.

According to an embodiment of the present invention, one of said first additional transistors is turned on before turning-on of the first transistor of the first channel type.

A further embodiment of the present invention is a method for controlling a DRAM sense amplifier, which includes the turning-on of the first additional transistor which is connected in parallel with the amplification branch opposite to that containing the read memory cells.

Another embodiment of the present invention is a DRAM of the type comprising an array network of cells connected to direct and complementary columns of bit lines and to word lines, and sense amplifiers.

According to an embodiment of the present invention, the memory has no reference cell precharged to a fixed voltage.

The foregoing features and advantages of the present invention will be discussed in detail in the following non-limiting description of specific embodiments in connection with the accompanying drawings.

DETAILED DESCRIPTION

Figure 1:
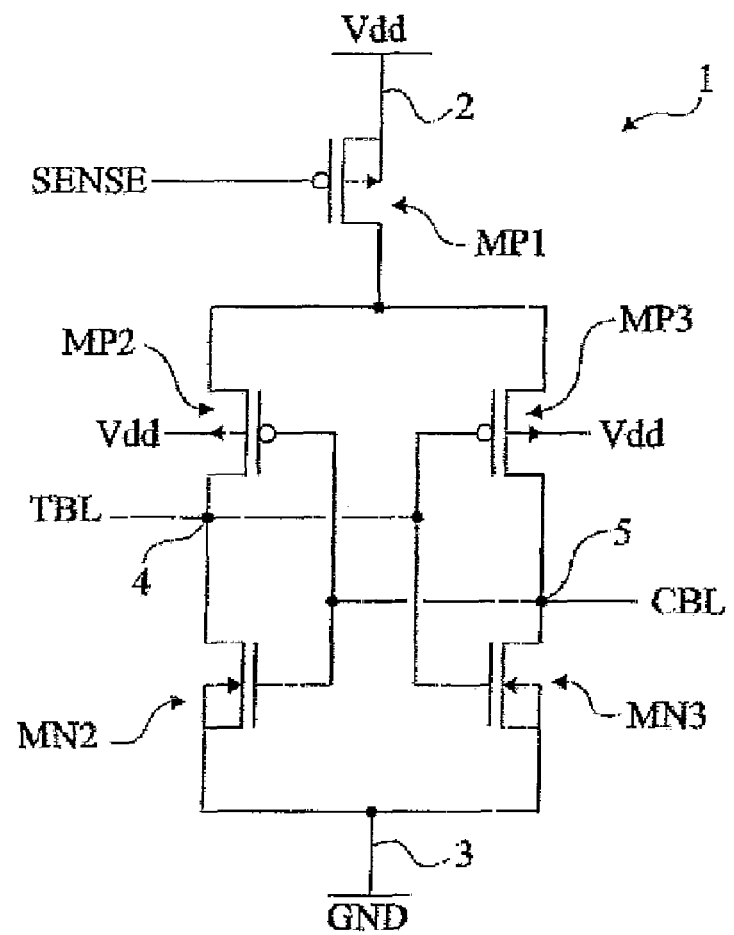
FIGS. 1 and 2, previously described, are intended to show the state of the art and the problem to solve.

The following discussion is presented to enable a person skilled in the art to make and use the invention. Various modifications to the embodiments will be readily apparent to those skilled in the art, and the generic principles herein may be applied to other embodiments and applications without departing from the spirit and scope of the present invention. Thus, the present invention is not intended to be limited to the embodiments shown, but is to be accorded the widest scope consistent with the principles and features disclosed herein.

Same elements have been designated with same reference numerals in the different drawings. For clarity, only those elements which are necessary to the understanding of embodiments of the present invention have been shown in the drawings and will be described hereafter. In particular, the control circuits of the different memory elements have not been detailed, with embodiments of the present invention being compatible with conventional circuits and especially line and column decoders. Further, the generation and the synchronization of the control signals of the sense amplifier have not been detailed, with embodiments of the present invention being here again compatible with tools generally used to generate such signals.

Figure 3:
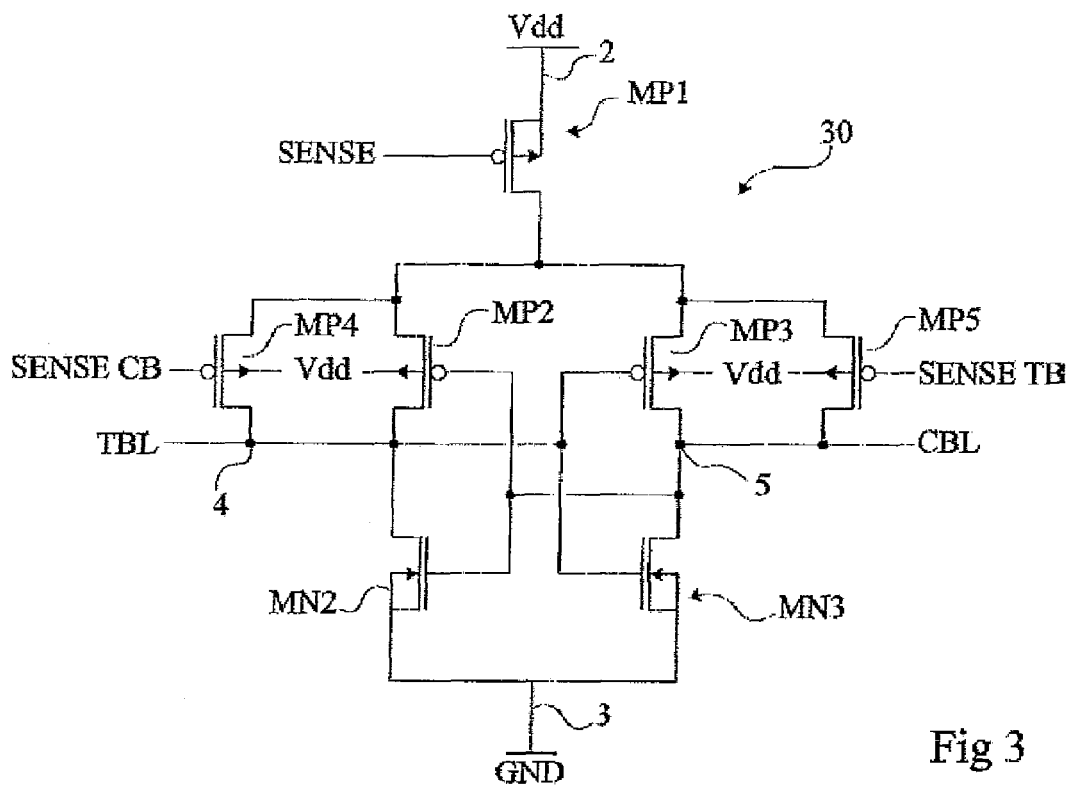
FIG. 3 shows a DRAM cell sense amplifier according to an embodiment of the present invention.

FIG. 3 shows a DRAM cell sense amplifier 30 according to an embodiment of the present invention.

As previously discussed, a P-channel transistor MP1 for controlling amplifier 30 connects a terminal 2 of application of a voltage Vdd to a stage forming a flip-flop formed of two parallel branches, each comprising a P-channel MOS transistor MP2, respectively, MP3, in series with an N-channel transistor MN2, respectively MN3. The respective sources of transistors MN2 and MN3 are connected to a terminal 3 of application of a ground voltage GND while the respective sources of transistors MP2 and MP3 are connected to the drain of transistor MP1. The junction points of transistors MP2, MN2, respectively, MP3 and MN3, define input/output terminals 4 and 5 of the sense amplifier intended to be respectively connected to a direct bit line TBL and to a complementary bit line CBL. The gates of transistors MP2 and MN2 are connected together to point 5 while the gates of transistors MP3 and MN3 are connected together to point 4 of the other branch. Points 4 and 5 define the output terminals of the amplifier.

According to this embodiment of the present invention, two additional P-channel transistors MP4 and MP5 are connected in parallel respectively on transistors MP2 and MP3. Transistors MP4 and MP5 are controlled by signals SENSE CB and SENSE TB. Transistors MP4 and MP5 have the function of dynamically biasing amplifier 30 during read cycles.

Figure 2:
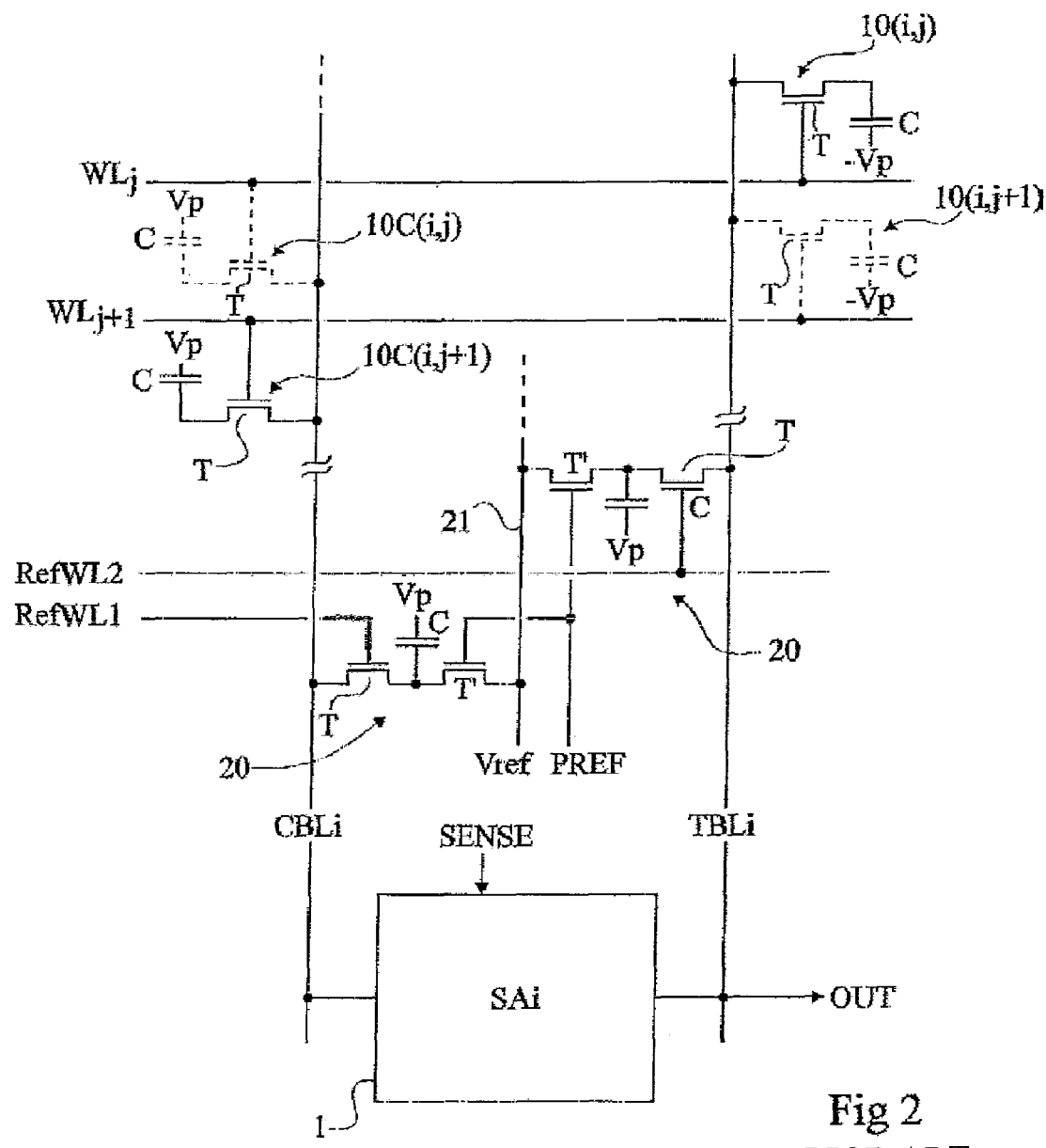

The memory architecture resembles that illustrated in FIG. 2, but without reference cells 20, which are now no longer necessary.

Figure 4A:
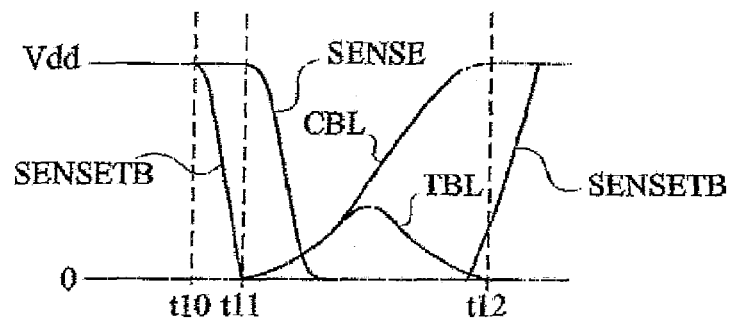
FIGS. 4A and 4B illustrate the operation of the amplifier of FIG. 3, respectively for the reading of a state 0 and of a state 1.

FIG. 4A illustrates the operation of amplifier 30 of FIG. 3 for the reading of a state 0 from line TBL.

It is assumed that the cell to be read from has been addressed by the word line before a time t10 so that no signal has been developed on line TBL, the read cell being at state 0. At time t10, signal SENSE TB is switched to state 0 to turn on transistor MP5 (transistor MP4 remaining off). At a subsequent time t11, signal SENSE of amplifier 30 is switched to the low state to turn on transistor MP1. The voltage of the two lines TBL and CBL starts increasing since both P-channel MOS transistors MP2 and MP3 are in the on state. Further, an additional current flows through transistor MP5, which causes an imbalance in the amplifier to the advantage of line CBL, which increases faster. This voltage difference is amplified by the flip-flop circuit and, at a time t12, line CBL is at the high state while line TBL is at the low state. Biasing transistor MP5 may be blocked from this time on by a state switching of signal SENSE TB.

Figure 4B:
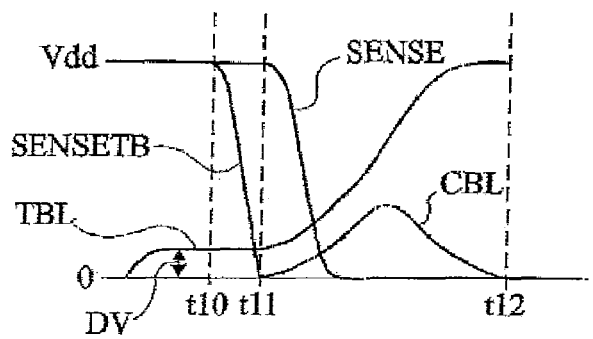

FIG. 4B illustrates the reading of a state 1 from line TBL. In this configuration, line TBL is not at state 0 but at a higher state (typically, a few hundreds of millivolts) before time t10, due to the opening of the memory point to be read by the switching of the corresponding word line. At time t11 where transistor MP5 is turned on by the switching to the low state of signal SENSE TB, the voltage of line CBL starts increasing. An additional current flows through transistor MP5. However, due to initial interval DV between the voltages of lines TBL and CBL, this current is not sufficient to switch line CBL to level Vdd and the obtained amplification results in an increase in the voltage of node 4 up to level Vdd, line CBL returning to 0.

Interval DV between the initial levels of lines TBL and CBL conditions the maximum width-to-length ratio (W/L) of transistors MP5 and MP4. This ratio must then not be too high to avoid, on turning-on of transistor MP1, for a reading of a state 1 to result in a switching of the amplification cell.

Time t10 when transistor MP5 is turned on (or MP4 if the reading is performed from line CBL) is of no importance, provided that it is performed before the amplification phase (before time t11).

Transistors MP2 and MP3 are those which must conduct, as in a conventional amplifier, the read current. They must further be fast as compared with transistors MP4 and MP5, which do not have this need.

The sizing of transistors MP2 and MP3 calls for a compromise since they are ideally desired to be fast (requiring a large width (W) to length (L) ratio), small (requiring small dimensions W and L) and matched (requiring a large product W*L).

Since transistors MP4 and MP5 do not have to be fast, the two other requirements (small and matched) result in dimension criteria compatible with each other.

Figure 5:
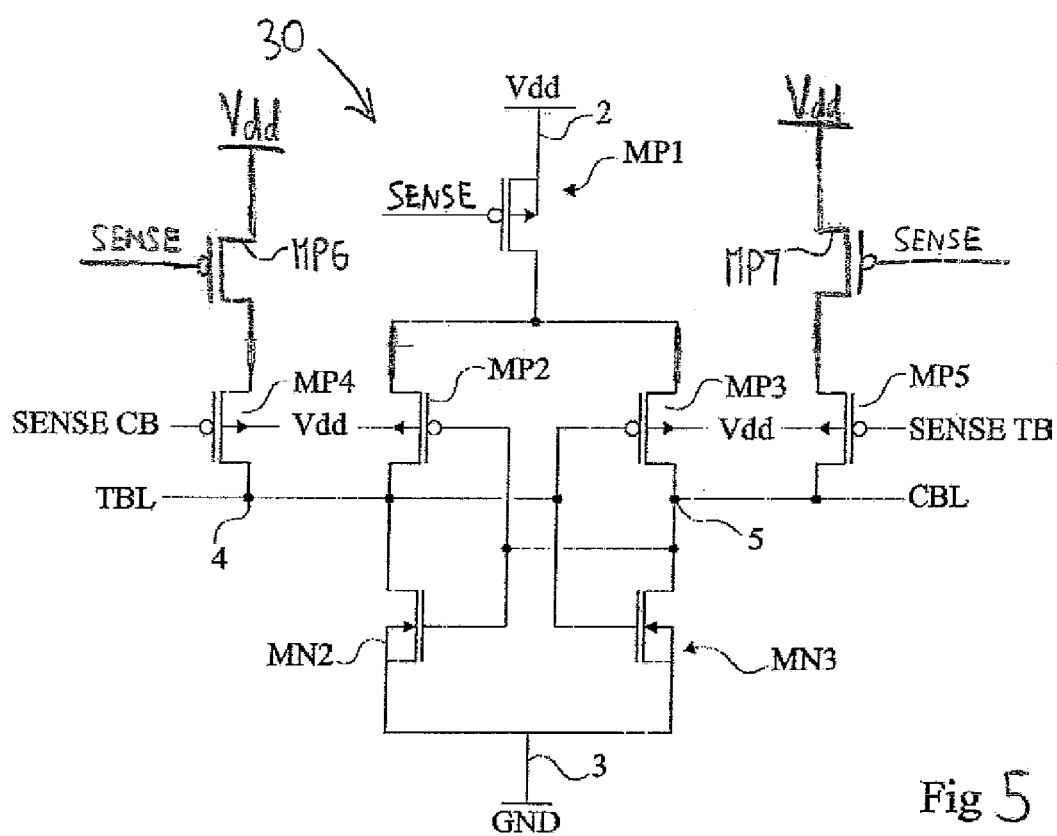
FIG. 5 is a schematic of a DRAM cell sense amplifier according to an alternative embodiment of the present invention.

According to an alternative embodiment shown in FIG. 5, the transistors MP4 and MP5 are each coupled in series with a second transistor MP6 and MP7, respectively, connecting them to supply line Vdd 2, which are then controlled by the signal SENSE. Such transistors MP6 and MP7 in this example have a P channel and generate a slight increase in the amplifier surface area.

In the illustrated example, the bulks of transistors MP2, MP3, MP4, and MP5 are brought to level Vdd, the bulks of transistors MN2, MN3, and MP1 being connected to their respective sources.

An advantage of embodiments of the present invention is that they enable suppression of the reference cells in the DRAM lines.

Another advantage of embodiments of the present invention is that it is now no longer necessary to provide voltage level generators for these references.

Another advantage of embodiments of the present invention is that they do not alter the amplifier performances while suppressing the reference cells.

Of course, embodiments of the present invention is likely to have various alterations, modifications, and improvements which will readily occur to those skilled in the art. In particular, the respective dimensions to be given to the different transistors of the amplifier are within the abilities of those skilled in the art based on the functional indications given hereabove and on the application.

Further, the adaptation of the control signals of the different transistors is within the abilities of those skilled in the art Moreover, if the connections of the different bulks of the transistors have been specified in the discussed embodiments, these are examples only and these connections may be adapted according to the application.

Finally, although an embodiment of the present invention has been described in relation with an application where the precharge is to ground, it also applies to a precharge to the positive supply level (Vdd) by inverting the transistor types and with an N-channel transistor controlled by signal SENSE connecting the differential amplification state to ground.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

A DRAM including sense amplifiers according to an embodiment of the present invention may be contained in a wide range of different types of electronic devices, such as in computer systems, cellular telephones, personal digital assistants, and so on.

The invention claimed is:

1. A sense amplifier of a DRAM comprising, in series between two terminals of application of a power supply voltage:
   at least one first transistor of a first channel type; and
   an amplification stage formed of two parallel branches each comprising a second transistor of the first channel type in series with a transistor of a second channel type, the gates of the transistors of a same branch being connected to the junction of the transistors of the other branch, each junction point defining a input/output terminal of the sense amplifier intended to be connected to a bit line,
   wherein each branch comprises at least one first additional transistor of the first channel type in parallel with at least each second transistor of the first channel type; and
   wherein each first additional transistor is in series with a second additional transistor of the same type between a first terminal of application of the supply voltage and said junction of the involved branch.

2. The amplifier of claim 1, wherein each first additional transistor is in parallel exclusively with the second transistor of the first channel type of the involved branch.

3. The amplifier of claim 1, wherein one of said first additional transistors is turned on before turning-on the first transistor of the first channel type.

4. A method for controlling the DRAM sense amplifier of claim 1, comprising turning-on the first additional transistor which is connected in parallel with the amplification branch opposite to that containing the read memory cells.

5. A DRAM of the type comprising an array network of cells connected to direct and complementary columns of bit lines and to word lines, and comprising sense amplifiers of claim 1.

6. The DRAM of claim 5, having no reference cell precharged to a fixed voltage.

7. A sense amplifier, comprising:
   a first inverter and a second inverter, the inverters being cross-coupled between a first bit line node and a second bit line node, and each inverter including a first channel type transistor and a second channel type transistor coupled in series between a first node adapted to receive a first voltage and a second node adapted to receive a second voltage, with the first bit line node being defined at the interconnection between the transistors in the first inverter and the second bit line node being defined at the interconnection between the transistors in the second inverter;
   a first additional transistor coupled in parallel with the first channel type transistor of the first inverter and adapted to receive a sense first bit line signal;
   a second additional transistor in series with the first additional transistor, the second additional transistor being of the same type as the first additional transistor and being coupled between a supply voltage node and a node of the first additional transistor;
   a third additional transistor coupled in parallel with the first channel type transistor of the second inverter and adapted to receive a sense second bit line signal; and
   a fourth additional transistor in series with the third additional transistor, the fourth additional transistor being of the same type as the third additional transistor and being coupled between the supply voltage node and a node of the third additional transistor.

8. The sense amplifier of claim 7 first channel type transistor comprises a PMOS transistor and the second channel type transistor comprises an NMOS transistor, and wherein the first and second additional transistors are PMOS transistors.

9. The sense amplifier of claim 7 wherein the first channel type transistors in the first and second inverters are matched transistors and the first and second additional transistors are matched transistors, and wherein each of the first channel type transistors has a channel width that is greater than a channel width of the first and second additional transistors.

10. The sense amplifier of claim 7 wherein the first voltage comprises a supply voltage and the second voltage comprises a ground voltage.

11. A memory device, comprising:
   an array of memory cells arranged in rows and columns, each memory cell in a respective column being coupled to one of an associated pair of first and second complementary bit lines and each memory cell in respective row adapted to receive a corresponding word line signal; and
   a plurality of sense amplifiers, each sense amplifier including a first bit line node coupled to a corresponding first complementary bit line and including a second bit line node coupled to associated second complementary bit line, each sense amplifier comprising:

a first and a second inverter, the inverters being cross-coupled between the first bit line node and the second bit line node, and each inverter including a first channel type transistor and a second channel type transistor coupled in series between a first node adapted to receive a first voltage and a second node adapted to receive a second voltage, with the first bit line node being defined at the interconnection between the transistors in the first inverter and the second bit line node being defined at the interconnection between the transistors in the second inverter;

a first additional transistor coupled in parallel with the first channel type transistor of the first inverter and adapted to receive a sense first bit line signal;

a second additional transistor in series with the first additional transistor, the second additional transistor being of the same type as the first additional transistor and being coupled between a supply voltage node and a node of the first additional transistor;

a third additional transistor coupled in parallel with the first channel type transistor of the second inverter and adapted to receive a sense second bit line signal; and a fourth additional transistor in series with the third additional transistor, the fourth additional transistor being of the same type as the third additional transistor and being coupled between the supply voltage node and a node of the third additional transistor.

12. The memory device of claim 11 wherein the memory cells comprise DRAM cells.

13. A memory device, comprising:

an array of memory cells arranged in rows and columns, each memory cell in a respective column being coupled to one of an associated pair of first and second complementary bit lines and each memory cell in respective row adapted to receive a corresponding word line signal; and a plurality of sense amplifiers, each sense amplifier including a first bit line node coupled to a corresponding first complementary bit line and including a second bit line node coupled to associated second complementary bit line, each sense amplifier comprising:

a first and a second inverter, the inverters being cross-coupled between the first bit line node and the second bit line node, and each inverter including a first channel type transistor and a second channel type transistor coupled in series between a first node adapted to receive a first voltage and a second node adapted to receive a second voltage, with the first bit line node being defined at the interconnection between the transistors in the first inverter and the second bit line node being defined at the interconnection between the transistors in the second inverter;

a first additional transistor coupled in parallel with the first channel type transistor of the first inverter and adapted to receive a sense first bit line signal;

a second additional transistor coupled in parallel with the first channel type transistor of the second inverter and adapted to receive a sense second bit line signal; and wherein during operation of each sense amplifier the word line of addressed row of memory cells is first activated and thereafter either the sense first bit line or sense second bit line signal is activated prior to supplying at least one of the first and second voltages to the first and second nodes, respectively.

14. An electronic system, comprising:

electronic circuitry including a memory device, the memory device comprising, an array of memory cells arranged in rows and columns, each memory cell in a respective column being coupled to one of an associated pair of first and second complementary bit lines and each memory cell in respective row adapted to receive a corresponding word line signal; and a plurality of sense amplifiers, each sense amplifier including a first bit line node coupled to a corresponding first complementary bit line and including a second bit line node coupled to associated second complementary bit line, each sense amplifier comprising:

a first and a second inverter, the inverters being cross-coupled between the first bit line node and the second bit line node, and each inverter including a first channel type transistor and a second channel type transistor coupled in series between a first node adapted to receive a first voltage and a second node adapted to receive a second voltage, with the first bit line node being defined at the interconnection between the transistors in the first inverter and the second bit line node being defined at the interconnection between the transistors in the second inverter;

a first additional transistor coupled in parallel with the first channel type transistor of the first inverter and adapted to receive a sense first bit line signal;

a second additional transistor in series with the first additional transistor, the second additional transistor being of the same type as the first additional transistor and being coupled between a supply voltage node and a node of the first additional transistor;

a third additional transistor connected coupled in parallel with the first channel type transistor of the second inverter and adapted to receive a sense second bit line signal; and a fourth additional transistor in series with the third additional transistor, the fourth additional transistor being of the same type as the third additional transistor and being coupled between the supply voltage node and a node of the third additional transistor.

15. The electronic system of claim 14 wherein the electronic circuitry comprises a computer system.

16. The electronic system of claim 15 wherein the memory device comprise a DRAM.

17. A method of sensing data stored in a memory cell coupled to a first complementary bit line, a sense amplifier being coupled between the first complementary bit line and a second complementary bit line and the method comprising:

accessing the memory cell from which data is sensed to thereby develop a voltage on the first complementary bit line, the voltage corresponding to the data stored in the cell;

supplying a dynamic biasing current to the second complementary bit line;

activating the sense amplifier;

driving a voltage on the first complementary bit line to a first voltage level and driving a voltage on the second complementary bit line to a second voltage level through the sense amplifier wherein the dynamic biasing current is supplied through a first channel type transistor in response to a sense bit line signal; and wherein the memory cell is accessed responsive to an active word line signal being applied to the memory cell;

wherein supplying the dynamic biasing current occurs responsive to sense bit line signal going active, the sense bit line signal going active after the word line signal goes active; and wherein the sense amplifier is activated responsive to an active sense signal, the sense signal going active after the sense bit line signal goes active.

18. The method of claim 17 further comprising deactivating the sense bit line signal a predetermined time after the sense signal goes active.

19. The method of claim 17 wherein the first voltage level comprises a supply voltage and the second voltage level is a ground reference voltage.

* * * * *

UNITED STATES PATENT AND TRADEMARK OFFICE
CERTIFICATE OF CORRECTION

PATENT NO. : 7,535,782 B2  Page 1 of 1
APPLICATION NO. : 11/439728
DATED : May 19, 2009
INVENTOR(S) : Marc Vernet et al.

It is certified that error appears in the above-identified patent and that said Letters Patent is hereby corrected as shown below:

In Claim 8, Column 6, Line 47, please insert the text -- wherein the -- before the text "first channel type".

In Claim 14, Column 8, Line 34, please cancel the text "connected".

In Claim 16, Column 8, Line 46, please change the text "comprise" to -- comprises --.

Signed and Sealed this

Fourteenth Day of July, 2009

JOHN DOLL
*Acting Director of the United States Patent and Trademark Office*